United States Patent
Qian

(10) Patent No.: US 8,266,557 B1
(45) Date of Patent: Sep. 11, 2012

(54) METHOD AND SYSTEM FOR DIRECTION DEPENDENT INTEGRATED CIRCUIT LAYOUT

(75) Inventor: Qi-De Qian, Santa Clara, CA (US)

(73) Assignee: Qi-De Qian, Santa Clara, CA (US)

( * ) Notice: Subject to any disclaimer, the term of this patent is extended or adjusted under 35 U.S.C. 154(b) by 1049 days.

(21) Appl. No.: 12/181,483

(22) Filed: Jul. 29, 2008

Related U.S. Application Data

(62) Division of application No. 10/907,814, filed on Apr. 15, 2005, now Pat. No. 7,448,012.

(60) Provisional application No. 60/564,082, filed on Apr. 21, 2004, provisional application No. 60/603,758, filed on Aug. 23, 2004.

(51) Int. Cl.
*G06F 17/50* (2006.01)

(52) U.S. Cl. ............ 716/54; 716/52; 716/112; 716/122; 716/139

(58) Field of Classification Search .......... 716/52, 716/54, 112, 122, 139
See application file for complete search history.

(56) References Cited

U.S. PATENT DOCUMENTS

| | | | |
|---|---|---|---|
| 5,018,074 A * | 5/1991 | Griffith et al. | 716/55 |
| 5,416,722 A * | 5/1995 | Edwards | 716/52 |
| 5,612,893 A * | 3/1997 | Hao et al. | 716/55 |
| 5,936,868 A * | 8/1999 | Hall | 716/54 |
| 6,324,673 B1 * | 11/2001 | Luo et al. | 716/52 |
| 6,357,036 B1 * | 3/2002 | Eka et al. | 716/112 |
| 6,516,450 B1 * | 2/2003 | Hill et al. | 716/112 |
| 6,569,583 B2 * | 5/2003 | Cho et al. | 430/5 |
| 6,749,971 B2 * | 6/2004 | Lukanc et al. | 430/5 |
| 6,834,380 B2 * | 12/2004 | Khazei | 716/115 |
| 6,970,759 B2 * | 11/2005 | Desplats et al. | 700/109 |
| 7,010,770 B2 * | 3/2006 | Liang et al. | 716/112 |
| 7,028,272 B2 * | 4/2006 | Mandal et al. | 716/119 |
| 7,194,725 B1 * | 3/2007 | Lukanc et al. | 716/52 |
| 7,303,842 B2 * | 12/2007 | Watson et al. | 430/5 |
| 2008/0028352 A1 * | 1/2008 | Birch et al. | 716/12 |

\* cited by examiner

*Primary Examiner* — Naum Levin

(57) ABSTRACT

In accordance with the present method and system for anisotropic integrated circuit layout we extract a set of anisotropic design rules for integrated circuit manufacturing systems that have directional preference. We enhance various physical design tools to read and process anisotropic design rules in order to generate anisotropic design layout that takes advantage of an anisotropic manufacturing system.

20 Claims, 7 Drawing Sheets

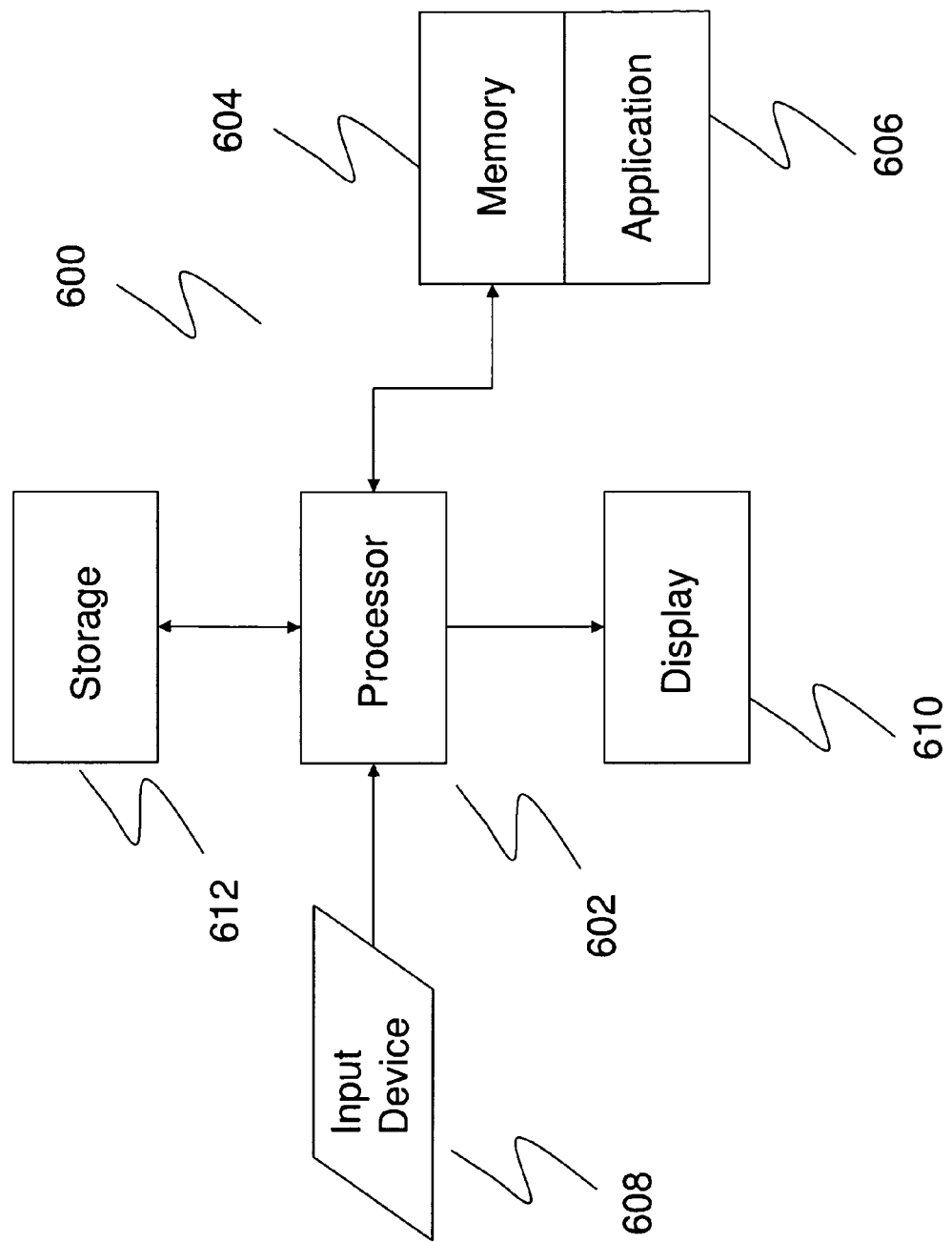

METHOD AND SYSTEM FOR DIRECTION DEPENDENT INTEGRATED CIRCUIT LAYOUT

CROSS REFERENCE TO ISSUED PATENTS AND RELATED APPLICATIONS

This application is a divisional of and claims priority to U.S. patent application Ser. No. 10/907,814 filed on Apr. 15, 2005 now U.S. Pat. No. 7,448,012 issued Nov. 4, 2008 to Qi-De Qian, entitled "Methods and System for Improving Integrated Circuit Layout", which claims priority to U.S. Provisional Patent Application Ser. No. 60/564,082 filed on Apr. 21, 2004, and U.S. Provisional Patent Application Ser. No. 60/603,758 filed on Aug. 23, 2004.

This application is also related to copending application by Qi-De Qian entitled "Method and System for Optimizing Integrated Circuit Layout" filed on even date herewith.

Each application referenced above is incorporated herein by reference in its entirety.

FIELD OF THE INVENTION

The present invention relates generally to integrated-circuit manufacturing and more particularly to methods and system for the generation, optimization, and verification of its layout artwork.

PRIOR ART

An integrated circuit ("IC") is a semiconductor device that includes many electronic components (e.g., transistors, diodes, etc.). These components are interconnected to form larger scale circuit building blocks (e.g., gates, cells, memory units, arithmetic units, controllers, decoders, etc.) on the IC.

Design engineers design IC's by transforming circuit description of the IC's into geometric descriptions, called layouts. To create an integrated circuit layout, design engineers typically use electronic design automation ("EDA") applications. These EDA applications provide sets of computer-based tools for creating, editing, and analyzing IC design layouts. EDA applications create layouts by using geometric shapes that represent different materials and devices on IC's. For instance, EDA tools commonly use rectangular lines to represent the wire segments that interconnect the IC components. These EDA tools also represent electronic and circuit IC components as geometric objects with varying shapes and sizes A layout is a blueprint for fabricating the IC on silicon. It typically comprise multiple layers representing diffusion, polysilicon, contact, via and metal layers etc.

A related but very different type of geometry representation is the mask layout. A mask is an object used by a lithography imaging system, whose image forms the desired pattern on silicon. In modern processing technologies, the geometry representation in a layout, or design layout, is very different from that in a mask layout. This is because the geometric representation in a mask layout is heavily pre-distorted by processes such as optical proximity correction (OPC) and phase shifting such that its image can best represent the desired pattern on silicon. In this disclosure, the term "layout" refers to design layout unless specifically pointed out otherwise.

In modern integrated circuit fabrication technology, the manufacturing yield depends heavily on the layout construction. For a given manufacturing process, a corresponding set of design rules are applied during chip layout to avoid geometry patterns that can cause yield failure. These design rules guarantee product yield by constraining layout geometry parameters such as minimum spacing between features and minimal line width to a set of values that can be easily fabricated.

In prior-art design systems, design rules are applied over a wide chip area and to entire classes of circuits. Furthermore, design rule constraint values do not differentiate one spatial orientation from another. This approach leads to simpler design implementation and design tool construction.

The drawback of this approach, however, is that the design rule must cover the worst case situation in all products. Failure to capture the absolute worst-case condition leads to systematic yield failure. The difficulty in finding the worst case condition, on the other hand, increases dramatically as the minimal feature dimension decreases compared to the interaction distance between features. For example, in an older technology, it is sufficient to specify the minimal space between two lines in order to avoid a short circuit. For recent technologies, this minimal space would depend on the line width on either side of the space and the interaction length between the lines. Instead of a single value, a table of allowable minimal space values will be required for various situations.

Emerging IC fabrication systems often prefer one spatial orientation. For example, in new photolithography technologies, polarization of the light source strongly influences the image quality. An image is sharper when the light polarization direction is in parallel with a line edge. Similar anisotropy can also arise from lithography systems that use off-axis dipole and other multiple illuminator arrangements which lack symmetry in two orthogonal orientations. In the extreme case, the illumination comprises two interfering plane waves where a conductive layer with patterns other than a simple grating pattern must be made with multiple exposures with potentially different resolution properties.

The anisotropic feature is often seen as a drawback that must be minimized in prior art fabrication processes. This is because significant and unknown changes to design tools and design methodology must be made, which involves changes in the IC industry ecosystem, including the electronic design automation (EDA) tools and layout design flow.

Because of these technical difficulties, significant investments have been made in order to make the manufacturing technology isotropic. However, by forcing isotropic condition on a fabrication process that is inherently anisotropic, prior art inevitably uses the worst case of the two unequal orientations and wastes both chip area and performance.

SUMMARY OF INVENTION

The present invention is directed to system and method for forming an anisotropic layout that is optimized for an orientation dependent fabrication technology.

A method for making integrated devices comprising first generating a set of design rule constraints that is different for two orthogonal orientations. These rules are summarized and passed to designers and design tools. During layout construction, electronic design automation tools are modified to force these anisotropic design constraints upon a layout artwork to generate an anisotropic layout. During the subsequent fabrication process, we align a preferred axis of orientation in the anisotropic fabrication process to the corresponding axis in the anisotropic layout, whereby the anisotropic nature of the fabrication process can utilized to our advantage.

To generate a set of anisotropic design rules, we design two sets of test patterns for evaluating the manufacturing capability in two orthogonal axes of orientations, one in parallel and the other perpendicular to the preferred direction manufacturing system. These test patterns are then fabricated using the same anisotropic fabrication process as that for final chip production. The fabricated patterns are analyzed to extract design rule constraint values from the minimal resolvable features corresponding to each axis of orientation. These rules, which have substantially different constraint distance values for the two orientations, are then become part of chip design and fabrication package.

A version of present invention modifies electronic design automation tools to read and process anisotropic design rules. Distance measures for two orthogonal axes of orientation follow different constraint values. The routing of a signal network is made to observe the direction of the wire, which has implications in parasitic capacitance and resistance values. Manufacturability verification system is made to differentiate layout orientation and apply different criteria for the two orthogonal directions. Circuit block placement by a 90 degree rotation is not permitted in a placement tool designed for anisotropic layout.

These and other features, aspects, and advantages of the present invention will become better understood with reference to the following description and appended claims.

BRIEF DESCRIPTION OF THE DRAWINGS

The invention is generally shown by way of example in the accompanying drawings.

FIG. 6 is a block diagram showing a system for implementing the anisotropic design rules, in accordance with one embodiment of the present invention.

Figure 1:
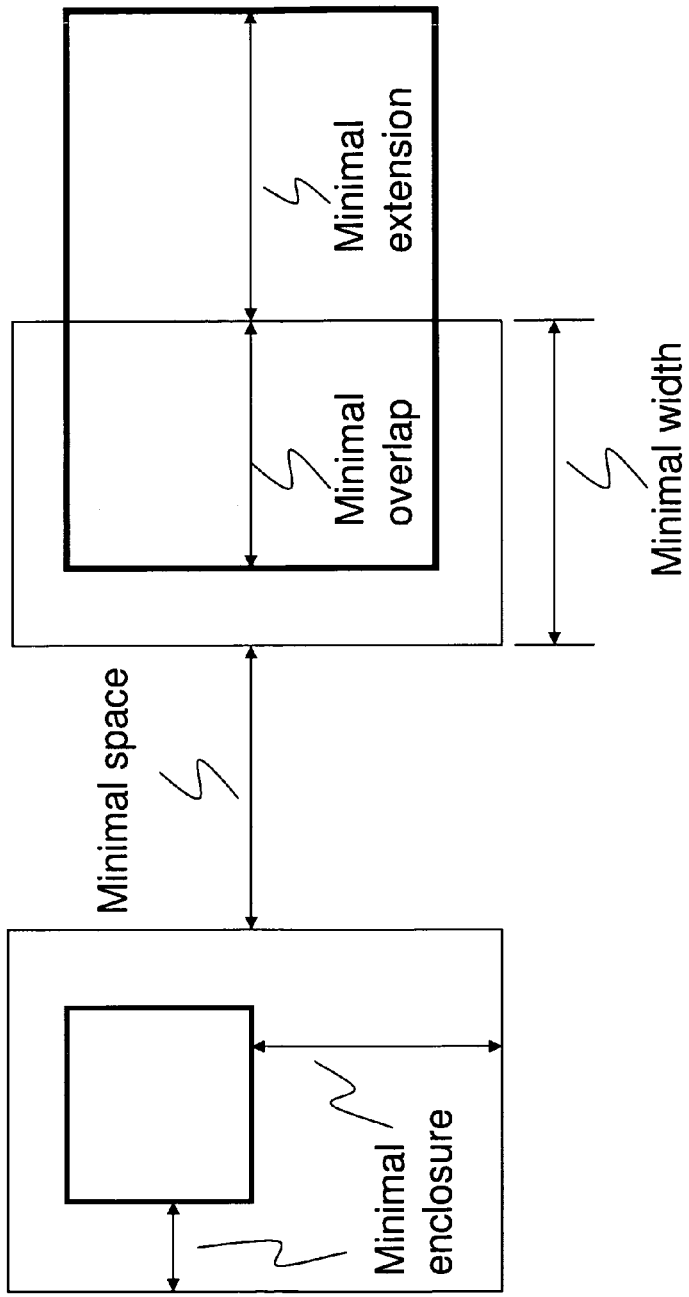
FIG. 1 illustrates the layout artwork terminology, in accordance with one embodiment of the present invention.

| Definition List 1 | |
|---|---|
| Term | Definition |
| Minimal width | Constraint distance between a pair of interior-facing edges that belong to the same layer. |
| Minimal space | Constraint distance between a pair of exterior-facing edges. |
| Minimal overlap | Constraint distance between a pair of interior-facing edges that belong to different layers. |
| Minimal enclosure | Constraint distance from an inside edge to an outside edge when the polygon of the inside edge is fully inside the polygon of the outside edge. |
| Minimal extension | Distance from an inside edge to an outside edge. |
| Anisotropic design rule | A design rule that has different constraint distances for a first axis of orientation (e.g. horizontal) and a |

-continued

| Definition List 1 | |
|---|---|
| Term | Definition |
| | second axis of orientation that is orthogonal to the first axis of orientation (e.g. vertical). |

DETAILED DESCRIPTION OF THE PREFERRED EMBODIMENTS

Some preferred embodiments of the present invention will be described in detail with reference to the related drawings of FIGS. 1-6. Additional embodiments, features and/or advantages of the invention will become apparent from the ensuing description or may be learned by the practice of the invention.

The methods and apparatus described here are with respect to integrated circuit manufacturing; however, the techniques described here can be applied to manufacturing or design of any device that require pattern transfer from a polygon database drawing to physical materials. Examples of these include integrated optical devices, microelectromechanical systems (MEMS), gene chips, micromachines, disk drive heads, etc.

The following description includes the best mode presently contemplated for carrying out the invention. This description is not to be taken in a limiting sense, but is made merely for describing the general principles of the invention.

The present invention is directed to methods for improving the layout of an integrated circuit by taking advantage of the orientation dependency of design and fabrication systems.

The orientation preference in fabrication technology often arises from the basic physics employed in the fabrication equipment. For example, in high numerical aperture lithography, one can optimize the polarization of the imaging light to achieve higher image resolution in a preferred direction.

Anisotropy can also arise from the fact that it is simpler to optimize the fabrication process in one direction alone than to optimize it equally well in all directions.

In the past, such anisotropic features are suppressed in order to simplify product design. Modifications in the fabrication machinery were made to strike a compromise between the performances in the two directions. The design rules are written such that sufficient safeguard is provided to cover the direction with inferior performance. This approach of seeking the lowest common denominator leads to waste in chip area and under utilization of manufacturing capability. As semiconductor processing technology approaches the limit of the underlining physics, new methods that exploit the special advantage of an anisotropic fabrication process becomes economically viable.

According to the present invention, we formulate two sets of design rules, one set for horizontal dimensions and another set for vertical dimensions. We construct physical layout tools to utilize these two separate sets of constraints. The layout designs resulting from this invention are anisotropic in that the horizontal and vertical directions obey different constraints for at least one of the minimal space, line width, overlap, enclosure, and extension rules. The exact definition of these design rule terms are listed in Definition List 1 and illustrated in FIG. 1.

In the present invention, design rules that have different constraint distances for horizontal and vertical directions are defined as anisotropic design rules. A layout that satisfy anisotropic design rules are defined as anisotropic layout.

Prior art design rules, i.e. those have the same constraint distances for horizontal and vertical directions, are defined as isotropic design rules, or simply design rules. A layout that satisfy isotropic design rules are defined as an isotropic layout.

The present invention comprises layout systems for the construction, optimization, and verification of layout artwork for a direction dependent processing technology. In a preferred embodiment, the present invention comprises: extracting two distinctive sets of constraint parameters to form an anisotropic design rule set, and modifying design tools to accept and utilize said anisotropic design rules.

Figure 2:
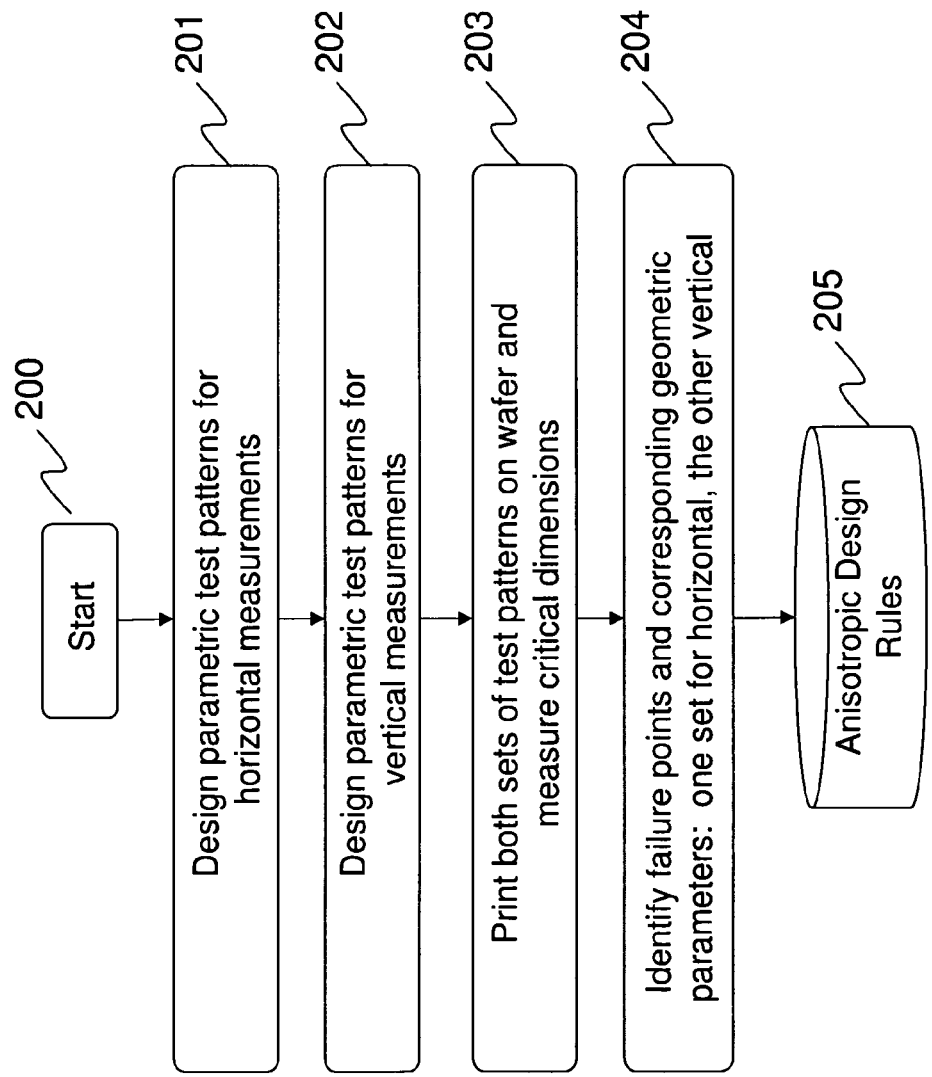
FIG. 2 shows the procedure for generating orientation dependent design rules, in accordance with one embodiment of the present invention.

FIG. 2 shows a flow diagram for generating anisotropic design rules. Following the start of the procedure (step 200), we design a set of test patterns with parameterized critical dimensions (step 201) that captures the manufacturing behavior relevant to layout design. For example, one set of test pattern consist of vertical line and space gratings with predetermined line and space width values. The range of width value covers all possible line and space widths to be used in chip design for the given processing technology. The increment for the width values is selected such that fabrication failure can be easily detected from measurements. Typically, the width parameter values are selected such that they cover both sub-resolution and large feature sizes, with finer parameter value increments near the estimated resolution limit. From step 201, the design rules in vertical direction will be extracted.

Similar test patterns are constructed for design rule extraction in the perpendicular (in this example, horizontal) direction (step 202). In a preferred embodiment, the test patterns in step 201 is copied and rotated by 90 degrees. From step 202, the design rules in horizontal direction will be extracted.

In another preferred embodiment, the test pattern in the perpendicular direction is arranged such that it forms an "L" shape with the test pattern in the first direction. Such an arrangement, commonly described as an "elbow" pattern, allows the evaluation of interactions between the two sets of patterns near their intersections. It is especially useful when the selection of the preferred direction is influenced by the layout itself.

The test pattern thus generated is written on the mask and printed on the wafer using a lithography system that is a representative of the anisotropic fabrication system intended for chip production. The printed pattern is measured with a metrology tool such as scanning electron microscope (step 203).

The measurement data as result of step 203 is analyzed in order to determine the minimal dimension at which features can be reliably printed on wafer (step 204). For an anisotropic image system, the measurements in horizontal direction and vertical direction would yield significantly different resolution limits.

In a preferred embodiment, the printability data are formulated into two sets of design rules for horizontal and vertical features respectively. The results of step 204 are summarized into anisotropic design rules (205) and distributed to layout designers in the form of design rule document or input commands for computer programs.

In another preferred embodiment, the printability data resulting from step 203 is used to fit a model that describes the behavior of the pattern transfer process. Unlike design rules that only provide pass or failure description, a model generates a continuum of manufacturing response that can be used by anisotropic layout generation tools (301) to construct a more manufacturing friendly layout than a purely rule based system.

Figure 3:
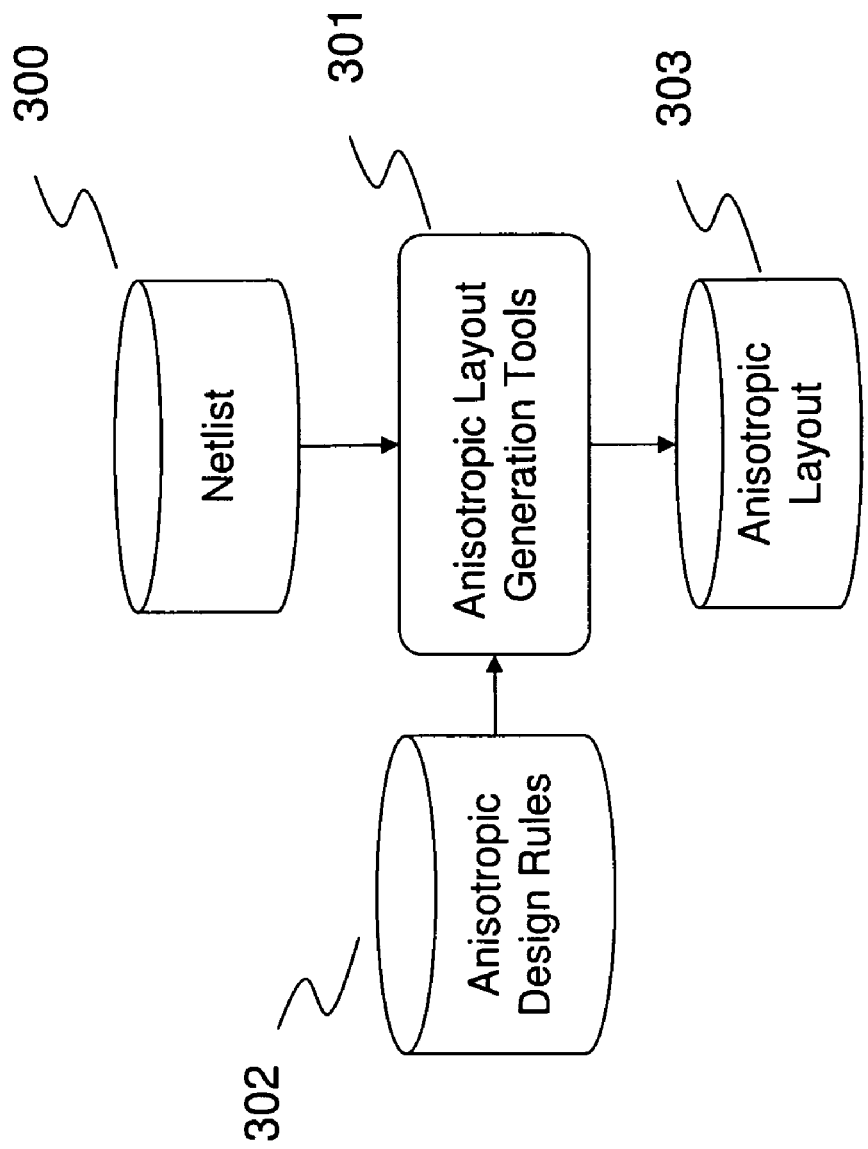
FIG. 3 is a block diagram for generating an anisotropic layout artwork, in accordance with one embodiment of the present invention.

FIG. 3 shows a flow diagram for generating optimal layout for a direction dependent processing technology. Starting with design database that contains the circuit netlist and performance target (300), we apply a set of software tools (301) to create a polygonal layout for fabrication. These tools comprise standard cell generation tool, memory generation tool, floor planning tool, placement tool, routing tool, layout editing tool, compaction tool, parasitic extraction tool, and design rule checking tool all of which are in the general category of electronic design automation (EDA) tools. The tool collection (301) uses anisotropic design rules (302) to restrict the relative positioning of polygon edges based on the orientation of the edges.

Figure 4:
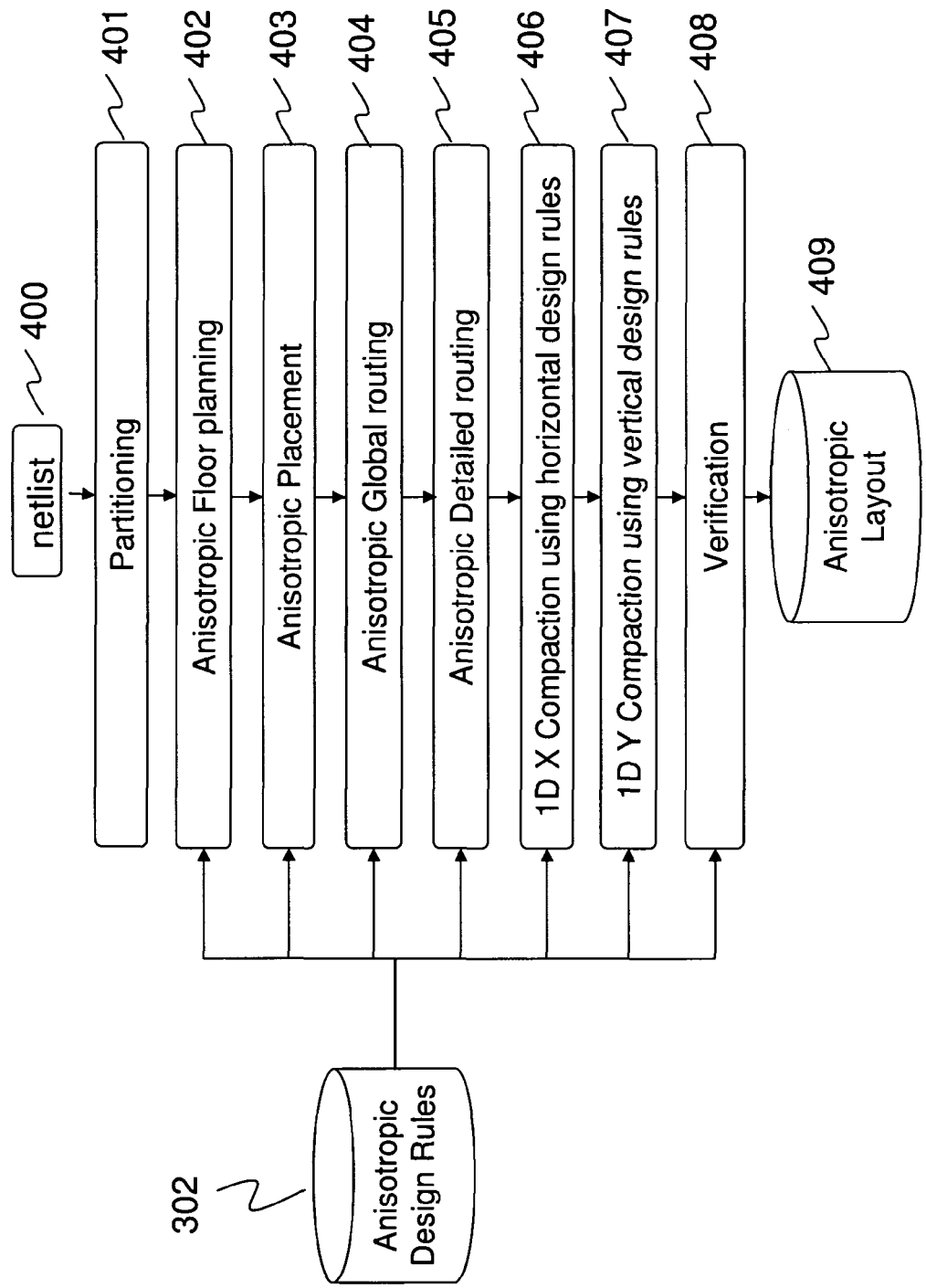
FIG. 4 is a flow diagram for generating an anisotropic layout artwork, in accordance with one embodiment of the present invention.

In a preferred embodiment, FIG. 4 shows a flow diagram for generating layout for an anisotropic image system. The steps performed in FIG. 4 uses a subset of the tool collection 301.

In the physical design of a typical integrated circuit, the chip is first partitioned into large functional building blocks (401). Each functional building block is assigned a piece of chip real estate during floor planning (402). Next, smaller building blocks within each functional building block are placed inside the allocated real estate (403). These smaller building blocks can be standard cells, which are among the smallest building blocks. After placement (403), a routing process takes place where the building blocks are connected to form electrical connections (404,405). Optionally, compaction steps (406,407) are performed to reduce the chip area. The layout thus created is verified in block 408 to make certain that tools perform the operation correctly. Design rule checking is one of the key verification operations, which checks for the compatibility of a layout to design rules.

The physical design operations use design rules in order to keep the layout manufacturable. Modifications must be implemented in order to adapt design tools for anisotropic design rules. During floor planning (402) and placement (403), a preferred orientation of the image system is used to optimize the shape, position and orientation of the circuit building blocks. More circuit element can be accommodated in the direction with higher resolution, while the direction with lower resolution has lower line-to-line parasitic capacitance and lower resistance due to there wider separation and wider line width. In routing modules 404 and 405, wiring direction dependent design rules from the memory are used for identifying obstacles, setting wire width and spacing, and estimating resistance and capacitance The completed anisotropic layout data is written into storage device 409 in a process known in the art as tapeout. Standard data format used for tapeout comprise GDSII, CIF, OASIS, and ASCII text.

Figure 5A:
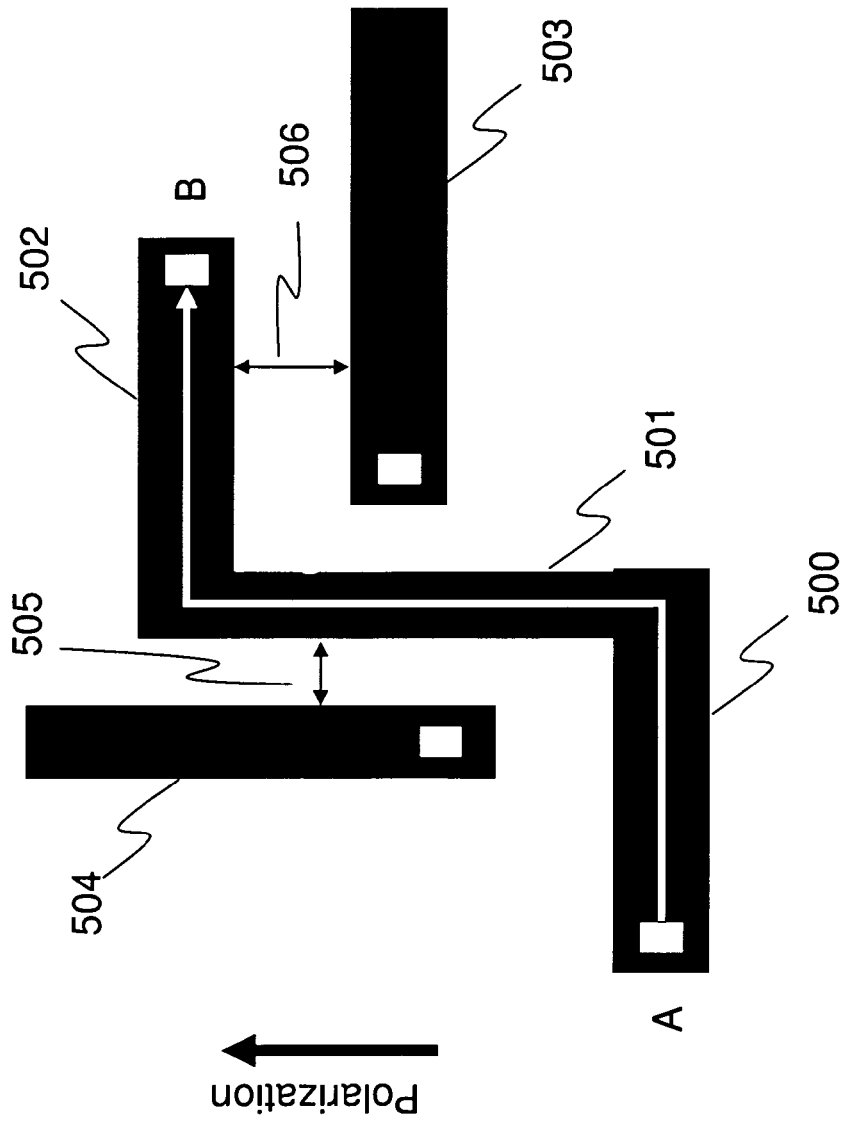
FIG. 5 illustrates orientation dependent routing on a conductive layer, in accordance with one embodiment of the present invention.

FIG. 5a shows a basic operation during wire routing. A wire is constructed by the routing algorithm to connect two points, A and B. In a preferred embodiment, starting from point A, while the wire is running horizontally (500), the application program fetches the minimal width of the horizontal wire from the memory and applies it to limit the width of the current wire segment. After turning 90 degrees (501), the wire now is running along the vertical direction, the application fetches the minimal width of the vertical wire from a different memory location and applies it to limit the minimal line width.

The wire is also kept at safe distances away from obstacles 503 and 504 using directional dependent minimal spacing rules. In a preferred embodiment, the layout generation system compares the separation 505 between vertical line segments 501 and 504 with the minimal spacing rule between vertical lines and reports error when this horizontal spacing constraint is violated. Said system compares the separation 506 between horizontal line segments 502 and 503, with the minimal spacing rule between horizontal lines and reports error when this vertical constraint is violated. In prior art physical design systems the minimal values for 505 and 506 are the same and equal to the minimal space rule, which can share the same memory location in a design system.

Figure 5B:
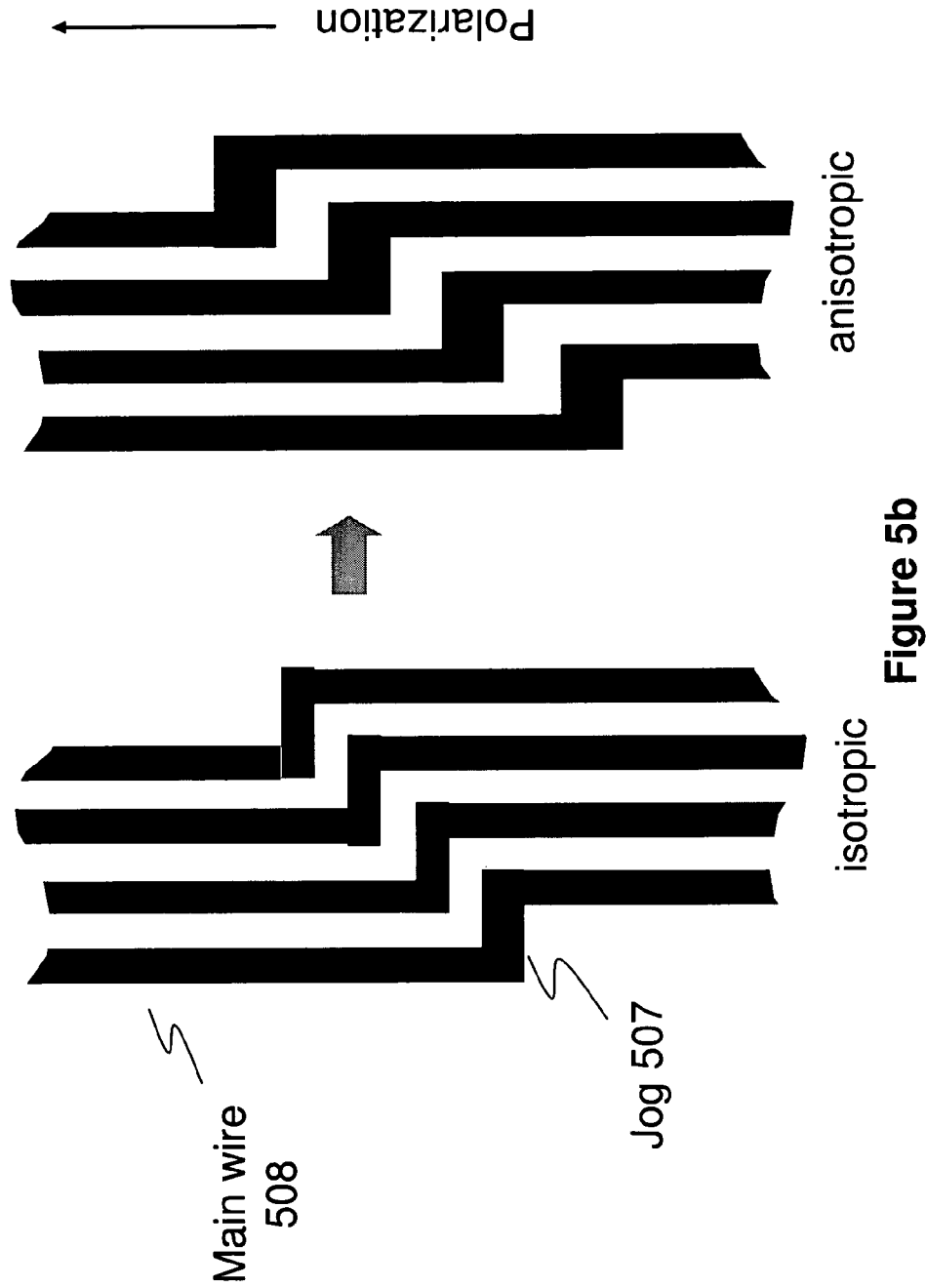

FIG. 5*b* illustrates the procedure for wire jog insertion. In physical layout flow, interconnecting wires are converted from paths to actual layout polygons. The preferred width for a path is specified in the technology file. In a preferred embodiment, two substantially different numbers representing minimal wire width in vertical and in horizontal directions are read from different input fields. During path to wire conversion, the main wire portion 508 uses width and spacing width for the vertical wires, while jog portion 507 uses width and spacing rules for horizontal wires in order to form correct interconnect routing on the same layer for the anisotropic fabrication technology.

In another preferred embodiment, design rule verification and compaction programs in FIG. 4 are constructed to accept and process anisotropic design rules. For example, the corner to corner constraint on a layout layer my now be expressed as the Euclidean distance $sqrt(d\_h*d\_h+d\_v*d\_v)$, where $d\_h$ and $d\_v$ are horizontal and vertical constraint distances respectively. In contrast, in an isotropic layout system, said corner constraint is $sqrt(2)*d0$, where $d0$ is the isotropic constraint distance.

Referring to FIG. 6, a block/flow diagram is shown for a system 600 of the present invention. System 600 includes a processor 602 that accesses memory device 604. Computer-readable medium comprises storage 612 and memory device 604 which stores an application software package 606 for implementing the present invention. A user interfaces with the processor 602 through an input device 608, which may include a keyboard, a mouse, a touch screen monitor, a voice recognition system or other known input devices. A display 610 is also included to display results, prompts, user inputs, graphics, etc.

While the present invention has been described in detail with regards to the preferred embodiments, it should be appreciated that various modifications and variations may be made in the present invention without departing from the scope or spirit of the invention. In this regard, it is important to note that practicing the invention is not limited to the applications described hereinabove. Many other applications and/or alterations may be utilized if such other applications and/or alterations do not depart from the intended purpose of the present invention.

It should further be appreciated by a person skilled in the art that features illustrated or described as part of one embodiment can be used in another embodiment to provide yet another embodiment such that the features are not limited to the specific embodiments described above. Thus, it is intended that the present invention cover such modifications, embodiments and variations as long as such modifications, embodiments and variations come within the scope of the appended claims and their equivalents.

What is claimed is:

1. A computer program product in a non-transitory computer-readable medium having program instructions for processing integrated device layout, comprising:
   program instructions for loading a design rule and associated first constraint;
   program instructions for loading a substantially different second constraint for said design rule;
   program instructions for processing layout coordinates along a first axis in said layout in accordance with said first constraint; and
   program instructions for processing layout coordinates along a second axis in said layout, said second axis being orthogonal to said first axis, in accordance with said second constraint.

2. The computer-readable medium of claim 1, wherein said design rule is selected from a group consisting of: minimal width, minimal spacing, and minimal overlap rules.

3. The computer-readable medium of claim 1, further comprising:
   program instructions for identifying the first axis from a layout object;
   program instructions for associating said first constraint with said first axis;
   program instructions for identifying the second axis from said layout object; and
   program instructions for associating said second constraint with said second axis.

4. The computer-readable medium of claim 1, further comprising program instructions selected from a group consisting of: instructions for checking violations to the first constraint along the first axis of orientation, instructions for checking violations to the second constraint along the second axis of orientation, instructions for checking violations to corner to corner distances using a combination of said first and said second constraints, and their combinations thereof.

5. The computer-readable medium of claim 1, further comprising program instructions for assigning the width of a wire segment in accordance with the axis of orientation of said wire segment.

6. The computer-readable medium of claim 1, further comprising program instructions for placing one or more layout building blocks by aligning the first axes in said building blocks to a predetermined axis.

7. The computer-readable medium of claim 1, wherein said program instructions for processing layout coordinates along the second axis comprising instructions for preventing feature formation along said second axis, whereby enforcing a grating structure on said layout.

8. A method for processing integrated device layout, implemented on one or more microprocessors, comprising:
   loading a design rule and associated first constraint;
   loading a substantially different second constraint for said design rule;
   processing, using said microprocessor, layout coordinates along a first axis in a layout object in accordance with said first constraint; and
   processing layout coordinates along a second axis in said layout object, said second axis being orthogonal to said first axis, in accordance with said second constraint.

9. The method of claim 8, wherein said design rule is selected from a group of consisting of: minimal width, minimal spacing, and minimal overlap rules.

10. The method of claim 8, further comprising identifying the first axis from a layout object and associating said first design rule constraint with said first axis; and identifying the second axis from said layout object and associating said second constraint with said second axis.

11. The method of claim 8, further comprising steps selected from a group consisting of: checking violations to the first constraint along the first axis of orientation, checking violations to the second constraint along the second axis of orientation, checking violations to corner to corner distances using a combination of said first and said second constraints, and their combinations thereof.

12. The method of claim 8, further comprising routing with conductive wire segments and assigning the width of said wire segment in accordance with the direction of said wire segment.

13. The method of claim 8, further comprising placing one or more layout building blocks by aligning the first axes in said building blocks to a predetermined axis.

14. The method of claim 8, wherein said second constraint prevents feature formation along said second axis of orientation, whereby forcing a grating structure on said layout.

15. The method of claim 8, further comprising identifying said first axis in said layout using properties of fabrication apparatus for fabricating said layout.

16. An integrated device product processed by the method of claim 8.

17. An apparatus for processing integrated device layout, comprising:
a first set of memory storage locations for a design rule and associated first constraint;
a second set of memory storage locations for a substantially different second constraint for said design rule;
a processor means for processing layout coordinates along a first axis in said layout in accordance with said first constraint and processing layout coordinates along a second axis in said layout object in accordance with said second constraint, said second axis being orthogonal to said first axis.

18. The apparatus of claim 17, wherein said processor means processes the layout coordinates along said second axis to enforce a grating pattern along said first axis.

19. The apparatus of claim 17, wherein said processor means
identifies the first axis of from a layout object and associates said first design rule constraint with coordinate variables on said first axis; and identifies the orthogonal axis to said first axis and associates said second constraint with coordinate variables on said orthogonal axis.

20. The apparatus of claim 17, further comprising means selected from a group consisting of: means for checking violations to the first constraint along the first axis of orientation, means for checking violations to the second constraint along the second axis of orientation, mean for checking violations to corner to corner distances using a combination of said first and said second constraints, and their combinations thereof.

\* \* \* \* \*